United States Patent
Yashima et al.

(10) Patent No.: US 11,588,498 B2
(45) Date of Patent: Feb. 21, 2023

(54) CHARACTER STRING SEARCH DEVICE AND MEMORY SYSTEM

(71) Applicant: Kioxia Corporation, Tokyo (JP)

(72) Inventors: Daisuke Yashima, Tachikawa Tokyo (JP); Kohei Oikawa, Kawasaki Kanagawa (JP); Sho Kodama, Kawasaki Kanagawa (JP); Keiri Nakanishi, Kawasaki Kanagawa (JP); Masato Sumiyoshi, Yokohama Kanagawa (JP); Youhei Fukazawa, Kawasaki Kanagawa (JP); Zheye Wang, Kawasaki Kanagawa (JP); Takashi Miura, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/472,431

(22) Filed: Sep. 10, 2021

(65) Prior Publication Data
US 2022/0255556 A1 Aug. 11, 2022

(30) Foreign Application Priority Data
Feb. 9, 2021 (JP) .............................. JP2021-019009

(51) Int. Cl.
| | | |
|---|---|---|
| *H03M 7/30* | (2006.01) | |
| *G06F 3/06* | (2006.01) | |
| *G11C 16/04* | (2006.01) | |

(52) U.S. Cl.
CPC ........ *H03M 7/3088* (2013.01); *G06F 3/0608* (2013.01); *G06F 3/0659* (2013.01); *G06F 3/0679* (2013.01); *G11C 16/0483* (2013.01)

(58) Field of Classification Search
None
See application file for complete search history.

(56) References Cited

U.S. PATENT DOCUMENTS

| | | |
|---|---|---|
| 5,140,321 A | 8/1992 | Jung |
| 5,371,499 A | 12/1994 | Graybill et al. |
| 7,233,265 B2 | 6/2007 | Cockburn et al. |
| 10,218,498 B2 | 2/2019 | Kulkarni |
| 2010/0312986 A1 | 12/2010 | Fujiwara |
| 2016/0117116 A1* | 4/2016 | Lee ....................... G06F 3/0647 711/104 |
| 2021/0058251 A1* | 2/2021 | Varadharajan ........ H04L 9/0643 |
| 2021/0375235 A1* | 12/2021 | Zheng ..................... G09G 5/10 |

FOREIGN PATENT DOCUMENTS

JP  2010-281695 A  12/2010

* cited by examiner

*Primary Examiner* — Charles Rones
*Assistant Examiner* — Jonah C Krieger
(74) *Attorney, Agent, or Firm* — Allen & Overy LLP

(57) ABSTRACT

According to one embodiment, a buffer stores first hash values and first complementary data. A first conversion unit converts consecutive characters in a second character string into second hash values and second complementary data. A search unit searches for consecutive first hash values from the buffer, and output a pointer. A selection unit selects consecutive first hash values and pieces of first complementary data from the buffer. A second conversion unit converts the consecutive first hash values into a third character string using the pieces of first complementary data. A comparison unit compares the second character string with the third character string to acquire a matching length. An output unit output the matching length with the pointer.

15 Claims, 7 Drawing Sheets

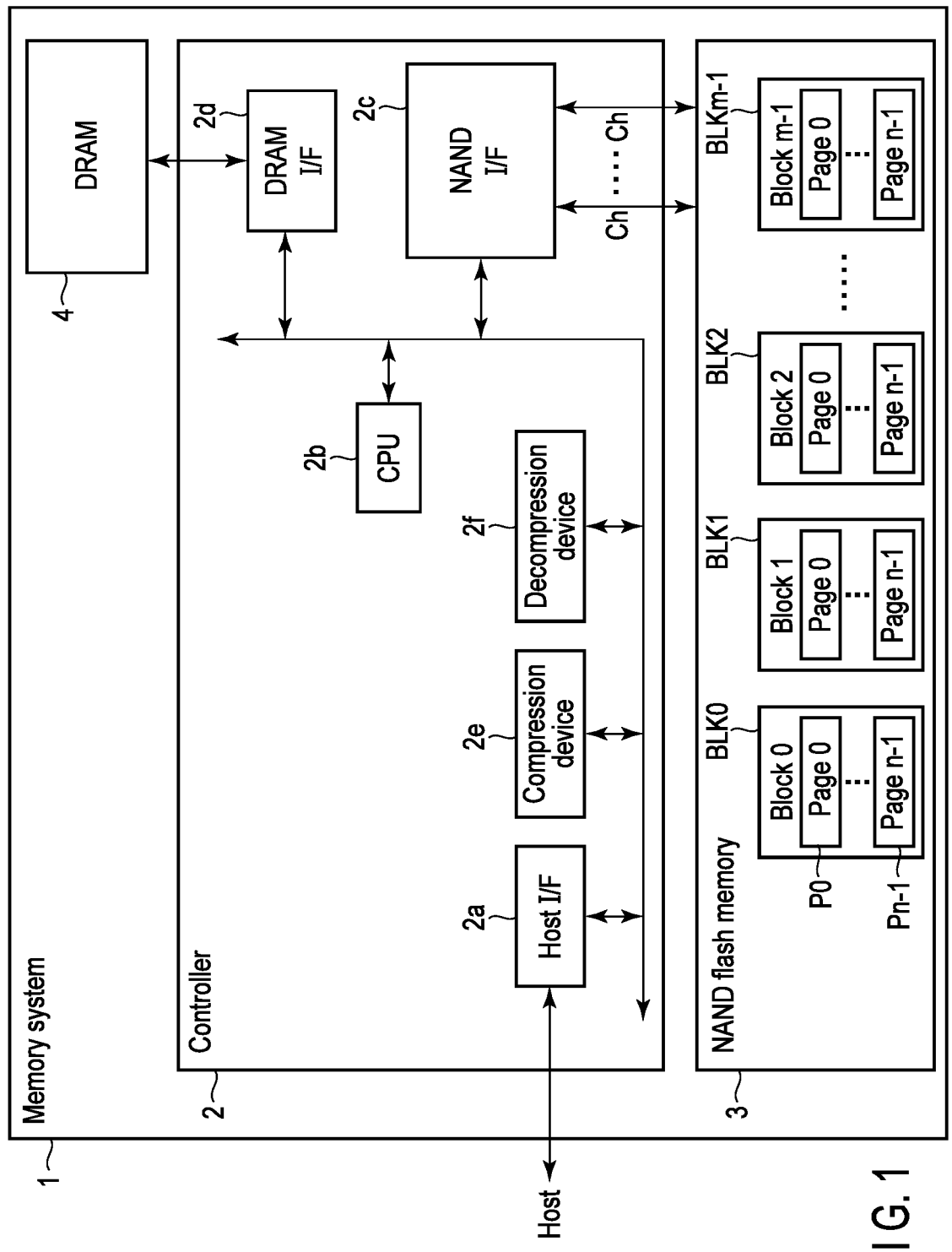
F I G. 1

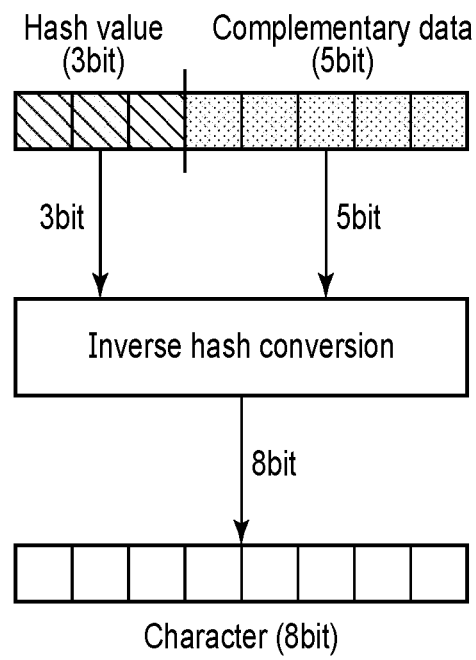
F I G. 7
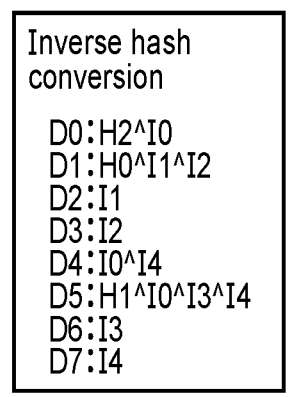
F I G. 8

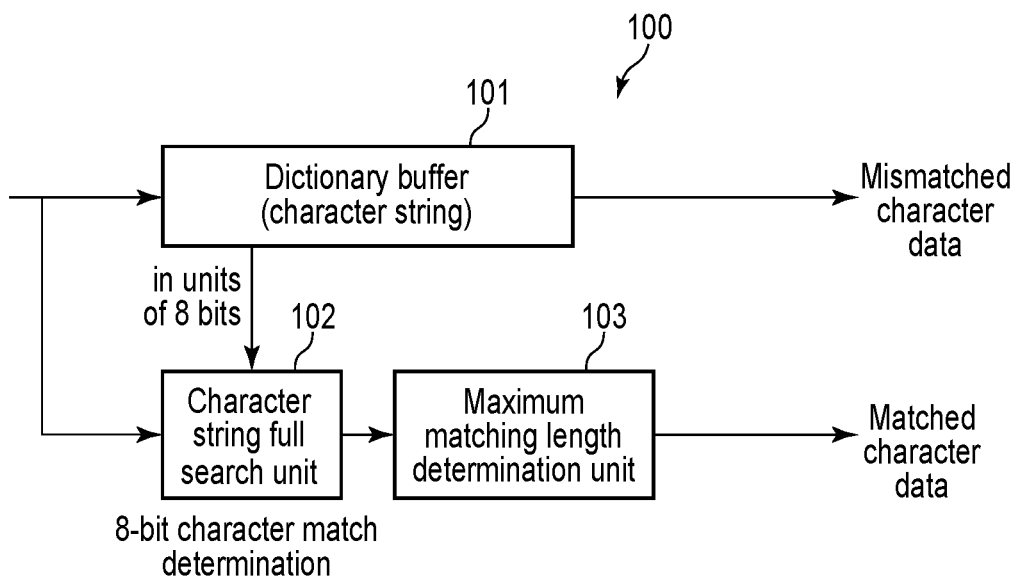
F I G. 9
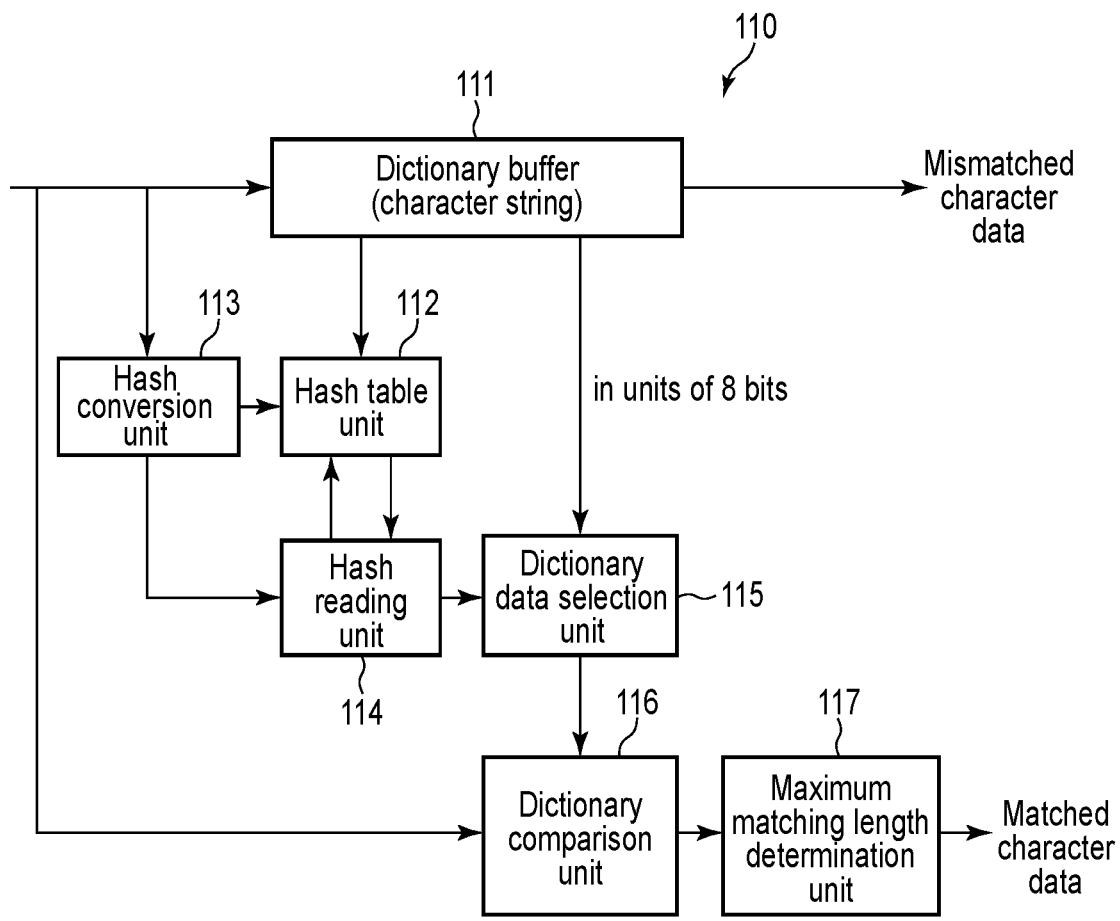
F I G. 10

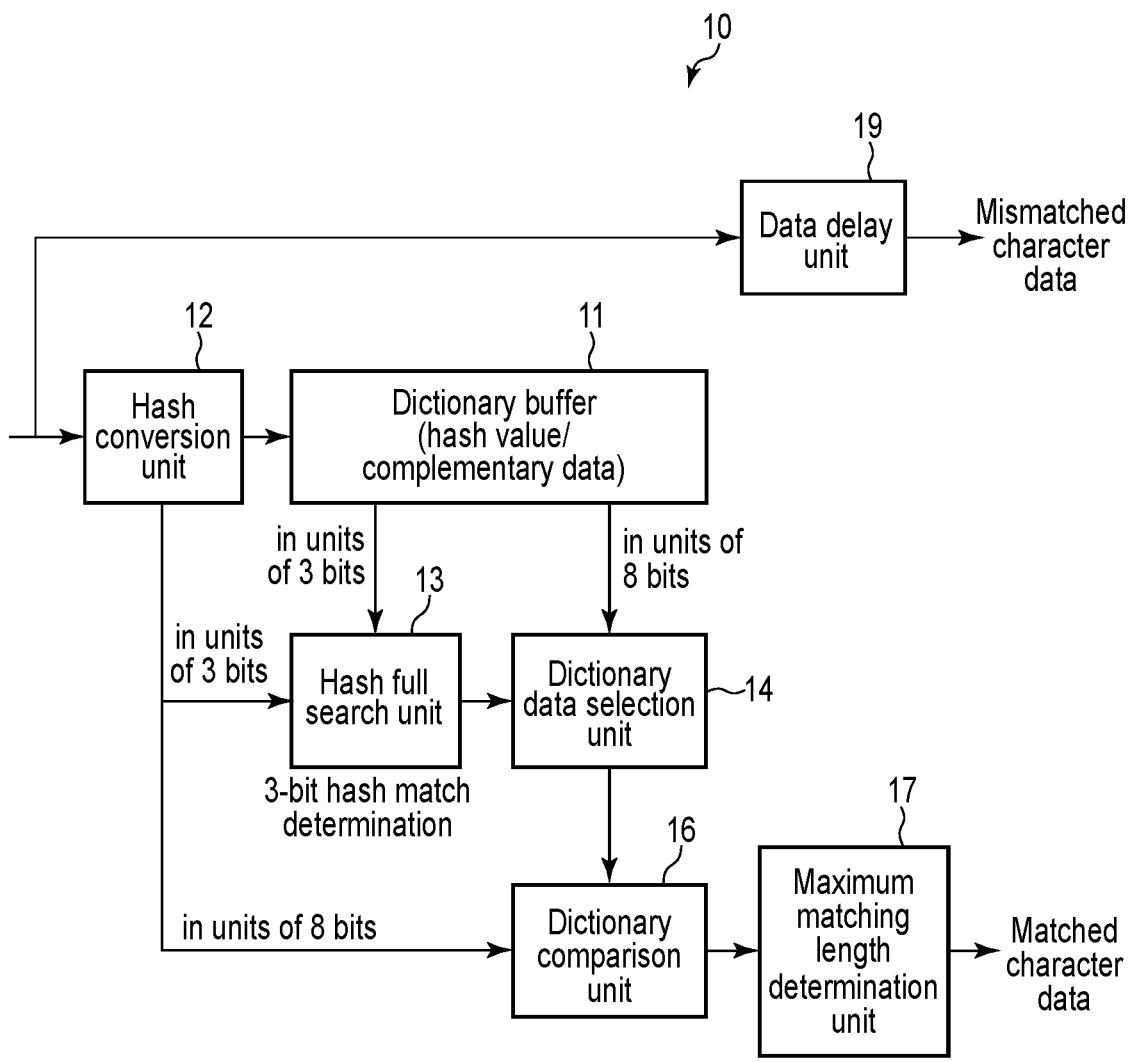
F I G. 13

400
CHARACTER STRING SEARCH DEVICE AND MEMORY SYSTEM

CROSS-REFERENCE TO RELATED APPLICATIONS

This application is based upon and claims the benefit of priority from Japanese Patent Application No. 2021-019009, filed Feb. 9, 2021, the entire contents of which are incorporated herein by reference.

FIELD

Embodiments described herein relate generally to a character string search device and a memory system.

BACKGROUND

In recent years, a memory system having a function of compressing data has been known in order to effectively utilize a memory area. In such a memory system, when a write command is issued from a host connected to the memory system, the data specified in the write command can be compressed and written to the non-volatile memory.

Dictionary coding is known as a coding method used for data compression. In the dictionary coding, a buffer in which past data (character string) called a dictionary is stored for a certain period is used, and thus, the past data that matches at least a part of input data (character string) is searched from the buffer. When the past data that at least partially match the input data exist in the buffer, a position (hereinafter, referred to as a pointer) of the past data in the buffer and a length (hereinafter, referred to as a matching length) that the input data and the past data match are output. The dictionary coding is a method of reducing the amount of code by replacing the input data with pointers and matching lengths in this way.

BRIEF DESCRIPTION OF THE DRAWINGS

FIG. 1 is a block diagram schematically illustrating an example of a hardware configuration of a memory system according to a first embodiment.

FIG. 7 is a diagram illustrating an outline of an inverse hash conversion according to the first embodiment.

FIG. 8 is a diagram illustrating an example of the inverse hash conversion according to the first embodiment.

FIG. 9 is a diagram for describing a first comparison example according to the first embodiment.

FIG. 10 is a diagram for describing a second comparison example according to the first embodiment.

FIG. 13 is a block diagram illustrating an example of a configuration of a character string search device according to a third embodiment.

DETAILED DESCRIPTION

Figure 2:
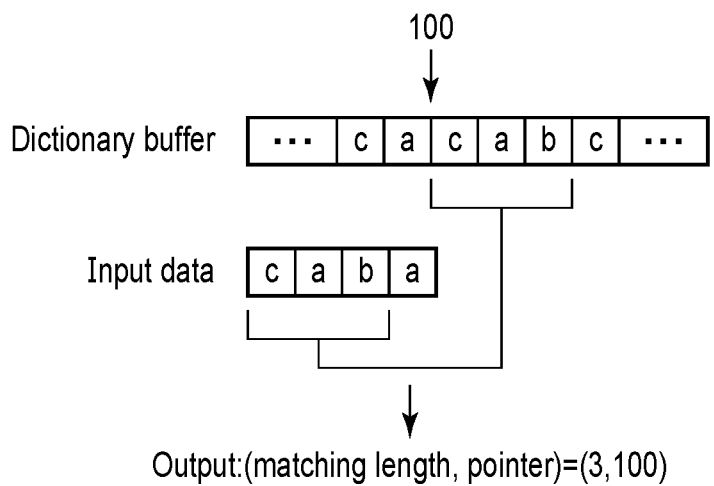
FIG. 2 is a diagram for describing an outline of a dictionary coding used in a compression method in a memory system of a comparison example.

Various embodiments will be described hereinafter with reference to the drawings.

In general, according to one embodiment, a character string search device includes a buffer, a first conversion unit, a search unit, a selection unit, a second conversion unit, a comparison unit, and an output unit. The buffer is configured to store, for each character, first hash values corresponding to each of a plurality of consecutive characters included in a first character string previously input and first complementary data corresponding to the first hash values for converting the first hash values into the characters. The first conversion unit is configured to convert each of a plurality of consecutive characters included in a second character string input into second hash values corresponding to the characters and second complementary data corresponding to the second hash values for converting the second hash values into the characters. The search unit is configured to search for consecutive first hash values matching at least part of the converted consecutive second hash values from the buffer, and output a pointer indicating a position in the buffer in which the consecutive first hash values is stored. The selection unit is configured to select consecutive first hash values and a plurality of pieces of first complementary data corresponding to each of the consecutive first hash values from the buffer based on the pointer. The second conversion unit is configured to convert the selected consecutive first hash values into a third character string including consecutive characters using the selected pieces of first complementary data. The comparison unit is configured to compare the second character string with the third character string to acquire a matching length indicating a length of matching characters. The output unit configured to output the matching length with the pointer.

First Embodiment

First, a first embodiment will be described. FIG. 1 is a block diagram schematically illustrating an example of a hardware configuration of a memory system according to a first embodiment.

A memory system 1 illustrated in FIG. 1 is a semiconductor storage device configured to write data (user data) to a non-volatile memory and read data from the non-volatile memory. The memory system 1 can be realized as, for example, a solid state drive (SSD).

The memory system 1 is configured to be connectable to a host via a system bus such as a PCI Express bus. As illustrated in FIG. 1, the memory system 1 includes a controller 2, a NAND flash memory 3, and a dynamic random access memory (DRAM) 4.

The controller 2 has a function of controlling an operation of the memory system 1. The controller 2 includes a host interface (I/F) 2a, a CPU 2b, a NAND interface (I/F) 2c, a DRAM interface (I/F) 2d, and the like. Note that the host interface 2a, the CPU 2b, the NAND interface 2c, and the DRAM interface 2d are connected to each other via, for example, a bus.

The host interface 2a is a host interface circuit configured to execute communication with the host arranged outside the memory system 1. The host interface 2a may be, for example, a PCI Express controller or the like. The host interface 2a receives various commands (requests) from the host.

The CPU 2b is a processor configured to control the host interface 2a, the NAND interface 2c, and the DRAM interface 2d. The CPU 2b loads a control program (firmware) from a NAND flash memory 3 or a read only memory (not illustrated) into a DRAM 4 in response to power-on of the memory system 1, and executes the control program to perform various types of processing. Specifically, the CPU 2b executes processing on various commands issued from the host. Note that some or all of the processing on the command issued from the host may be executed by dedicated hardware in the controller 2.

The NAND interface 2c is a memory control circuit configured to control the NAND flash memory 3 under the control of the CPU 2b.

Further, the controller 2 includes a compression device (compressor) 2e and a decompression device (decompressor) 2f.

The compression device 2e is used to input data specified in a write command and compress the data when the write command is issued from the host, for example. Note that the compression device 2e compresses data by a compression method that combines, for example, dictionary coding and entropy coding. The data (hereinafter, referred to as compressed data) compressed in the compression device 2e is output from the compression device 2e, and then, subjected to predetermined processing such as an error correction processing or a randomization processing. The CPU 2b writes data obtained by executing the predetermined processing on the compressed data to the NAND flash memory 3 via the NAND interface 2c. That is, the CPU 2b writes the data based on the compressed data output from the compression device 2e to the NAND flash memory 3.

For example, when reading the compressed data from the NAND flash memory 3 based on a read command received from the host via the host interface 2a, the CPU 2b reads the data based on the read command from the NAND flash memory 3 via the NAND interface 2c. The predetermined processing such as the error correction processing and the randomization cancellation processing are executed on the read data, and then the read data is input to the decompression device 2f by the CPU 2b as the compressed data, and the decompression device 2f decomposes the input compressed data. That is, the decompression device 2f decompresses the compressed data based on the data read from the NAND flash memory 3.

The NAND flash memory 3 is a non-volatile memory and includes a memory cell array including a plurality of memory cells arranged in a matrix. The NAND flash memory 3 may be a NAND flash memory of a two-dimensional structure or a NAND flash memory of a three-dimensional structure.

A memory cell array of the NAND flash memory 3 includes a plurality of blocks BLK0 to BLKm−1. Each of the blocks BLK0 to BLKm−1 is organized by a plurality of pages (here, pages P0 to Pn−1). The blocks BLK0 to BLKm−1 function as erase units. Each of the pages P0 to Pn−1 includes a plurality of memory cells connected to the same word line. The pages P0 to Pn−1 are units of data write operation and data read operation.

Here, the memory system 1 has been described as including the NAND flash memory 3, but the memory system 1 may be configured to include, for example, a phase change memory (PCM) or a magnetoresistive random access memory (MRAM) as the non-volatile memory.

The DRAM 4 is a volatile memory, and functions as, for example, a temporary buffer for software executed in the controller 2 (CPU 2b), a temporary buffer for the NAND flash memory 3, or the like.

Here, the memory system 1 is described as including the DRAM 4, but the memory system 1 may be configured to include, for example, a static random access memory (SRAM) or the like as the volatile memory.

Although the compression device 2e and the decompression device 2f have been described as being incorporated in the controller 2 in FIG. 1, one or both of the compression device 2e and the decompression device 2f may be provided outside the memory system 1 or the controller 2.

Hereinafter, an outline of the dictionary coding used in the compression method in the memory system of the comparison example will be described with reference to FIG. 2. Here, the data input as the target of the dictionary coding is referred to as the input data, and the input data will be described as a character string (text data) including a plurality of consecutive characters.

Here, the dictionary coding is a coding method that converts input data into a relative reference to data (that is, data that is input in the past) that is input as the target of the dictionary coding before the input data.

Therefore, in the dictionary coding, the data (character string) input in the past is stored in a buffer (hereinafter, referred to as a dictionary buffer) called a dictionary, and is searched (retrieved) whether data (forward data) that matches all or some of the input data exists in the dictionary buffer. When data matching all or part of the input data exists in the dictionary buffer, a pointer indicating the position of the data in the dictionary buffer and a matching length indicating the length of the matching character in the input data and the data searched from the dictionary buffer is output.

Here, FIG. 2 illustrates that the input data (character string) is "caba", and the dictionary buffer stores " . . . cacabe . . . " as the data (character string) input in the past. According to the example illustrated in FIG. 2, the target data "caba" (a part thereof) matches two characters "ca" and three characters "cab" in the history buffer. If the longer part of the input data can be replaced with the relative reference, coding efficiency is high, and therefore, the "cab" in the dictionary buffer is selected as data (hereinafter, referred to as dictionary data) that partially matches the input data.

It is assumed that the pointer (address) indicating the position of the dictionary data ("cab") selected in this way in the dictionary buffer is "100". In addition, since the "cab" of the input data and the "cab" of the dictionary data match, the above-described matching length is "three (characters)".

In this case, as a result of the dictionary coding for the input data "caba", the set of the matching length and the pointer (3,100) is output in the latter stage.

Note that the above-described input data corresponds to some data (data having a predetermined size) constituting the data (hereinafter referred to as write data) specified in the write command issued from host, and in the dictionary coding, processing of consecutively inputting each of the data constituting the write data from a head of the write data and sequentially coding the input data is executed.

In the example illustrated in FIG. 2 described above, processing of treating a trailing "a" that does not match the dictionary data in the input data "caba" illustrated in FIG. 2 as the next input data together with the subsequent data is repeated.

In FIG. 2, the case where the dictionary data matching all or part (that is, at least a part) of the input data exists in the dictionary buffer has been described, but when the dictionary data does not exist, the input data (that is, raw data) is output to the latter stage as a result of the dictionary coding.

In the following description, the set of matching length and pointer output as the result of dictionary coding is referred to as matched character data, and the raw data output as the result of the dictionary coding is referred to as mismatched character data.

However, the above-described dictionary coding is a coding method that searches newly input data (character string) from the past data (character string) stored in the dictionary buffer, and reduces a code amount by replacing a position (pointer) of the searched data with the length (matching length) of the matching characters in the input data and the past data. Therefore, in the dictionary coding, it is important to efficiently search the past data that matches at least a part of the input data from the data stored in the dictionary buffer.

However, for example, when high throughput is required from an information processing system (host) including the memory system 1, in order to improve the above-described search performance, it is necessary to prepare circuits that operate in parallel, and thus, the circuit scale becomes larger. Meanwhile, when an attempt is made to suppress the circuit scale, the search performance (and throughput) will decrease. That is, there is a trade-off relationship between the search performance and the circuit scale, and it is difficult to realize high search performance on a small circuit scale.

Therefore, in the first embodiment, a configuration for realizing high search performance for performing dictionary coding on a small circuit scale is adopted.

As described above, in the compression device 2e of the first embodiment, data is compressed by, for example, a compression method combining the dictionary coding and the entropy coding, but the compression device 2e includes a device that searches a character string from a dictionary buffer and performs dictionary coding (hereinafter referred to as a character string search device) and a device that performs entropy coding on the result of the dictionary coding (hereinafter referred to as an entropy coding device).

The entropy coding is a coding method that reduces (that is, compresses) the code amount as a whole by assigning codes with different code lengths to the data by utilizing the difference in a frequency of appearance of data, and is executed as the latter stage of the dictionary coding. In this case, for example, processing is executed in which a short code is assigned to the matched character data and the mismatched character data having a high frequency of appearance, and a long code is assigned to the matched character data and the mismatched character data having a low frequency of appearance.

As the entropy coding, for example, Huffman coding is used. When the Huffman coding is used as the entropy coding, the Huffman coding may be a static Huffman coding that performs coding using a pre-constructed code tree, or may be dynamic Huffman coding which changes a code tree according to matched character data and mismatched character data input as the target of the Huffman coding. As the entropy coding, for example, arithmetic coding or the like may be used.

Figure 3:
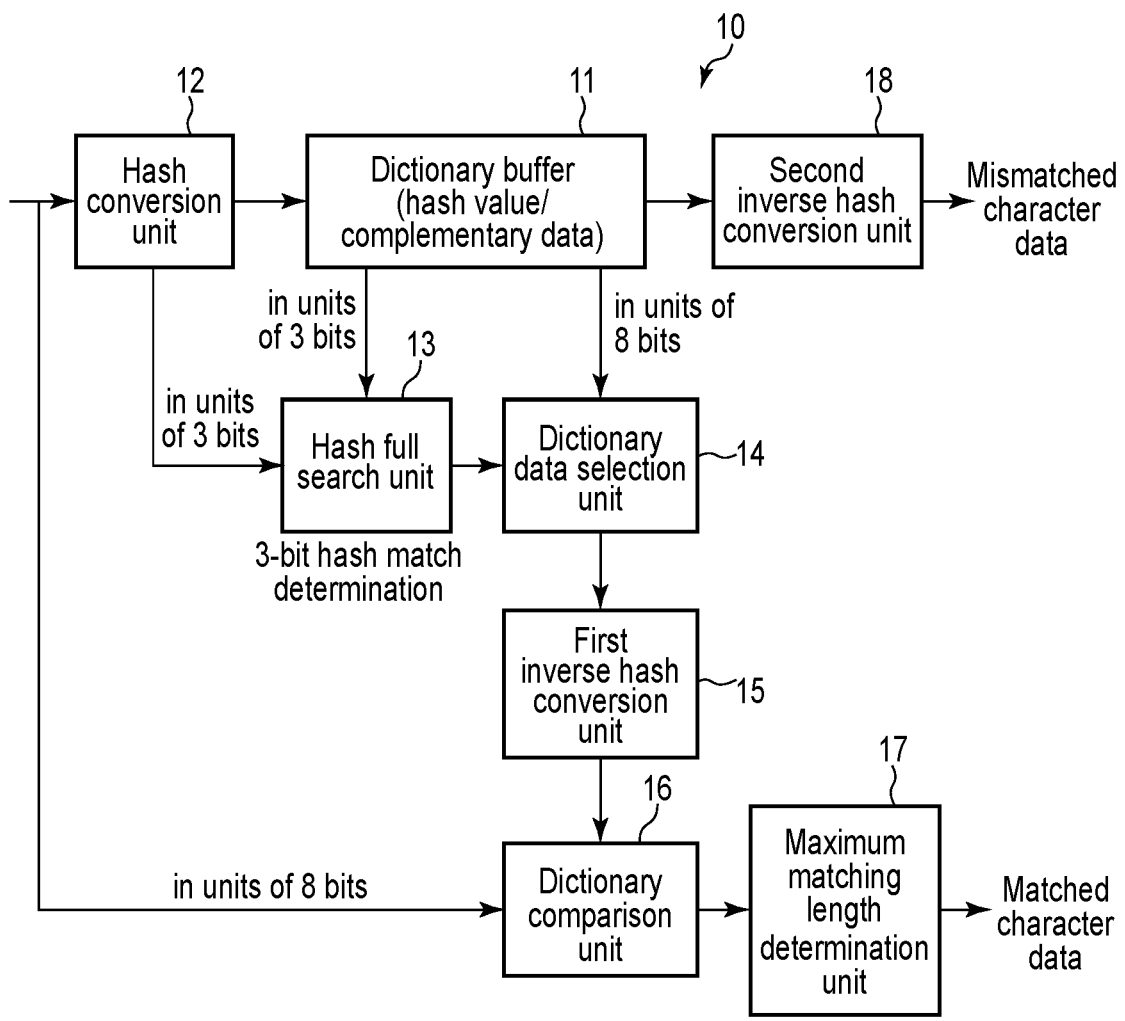
FIG. 3 is a block diagram illustrating an example of a configuration of a character string search device according to a first embodiment.

Hereinafter, the character string search device according to the first embodiment will be described in detail. FIG. 3 is a block diagram illustrating an example of a configuration of the character string search device according to the first embodiment.

As illustrated in FIG. 3, the character string search device 10 includes a dictionary buffer (dictionary unit) 11, a hash conversion unit 12, a hash full search unit 13, a dictionary data selection unit 14, a first inverse hash conversion unit 15, a dictionary comparison unit 16, a maximum matching length determination unit 17, and second inverse hash conversion unit 18.

The dictionary buffer 11 stores, for each character, hash values corresponding to each of a plurality of consecutive characters included in the character string (past character string data) input to the character string search device 10 (compression device 2e) in the past, and complementary data corresponding to the hash values. In the first embodiment, the complementary data corresponds to the inverse hash conversion data used for inversely converting the corresponding hash value into a character (that is, for restoring the character from the hash value).

In the following description, the set of the hash value corresponding to a character and the complementary data corresponding to the hash value is referred to as the converted character data for convenience. That is, the dictionary buffer 11 stores the past converted character data (converted character data corresponding to the characters included in the character string input in the past). Further, it is assumed that the converted character data corresponding to each character is stored in the dictionary buffer 11 in the order in which the character is input to the character string search device 10.

The hash conversion unit 12 receives the character string (hereinafter referred to as an input character string) newly input to the character string search device 10 as input data. Note that the input character string includes a plurality of consecutive characters, but each of the characters is represented by, for example, 8 bits (1 byte). In addition, the number of characters constituting the input character string is, for example, 8, 16, 32, or the like, but may be another number.

The hash conversion unit 12 applies the hash conversion in units of characters included in the input character string (that is, executes the hash conversion processing). As a result, the hash conversion unit 12 converts each of the plurality of consecutive characters included in the input character string into hash values corresponding to the characters (that is, the hash values are generated from the characters).

It is assumed that the hash value converted by the hash conversion unit 12 has a bit width smaller than a bit width (the number of bits) of the character converted into the hash value. Further, it is assumed that the hash conversion is performed by a certain operation, and the hash values (values of each bit constituting the hash values) reflect the values of all the bits of the characters to be converted into the hash values.

At the same time, the hash conversion unit 12 applies complementary data conversion in units of characters included in the input character string (that is, executes the complementary data conversion processing). As a result, the hash conversion unit 12 converts each of the plurality of consecutive characters included in the input character string into the complementary data (that is, the complementary data is generated from the character).

The complementary data can be defined as the bit width smaller than the bit width (the number of bits) of the character converted into the complementary data. For example, it is preferable that the total bit width of the hash value and the complementary data converted from one character by the hash conversion unit 12 is the same as the bit width of the character.

Figures 4, 5, 6:
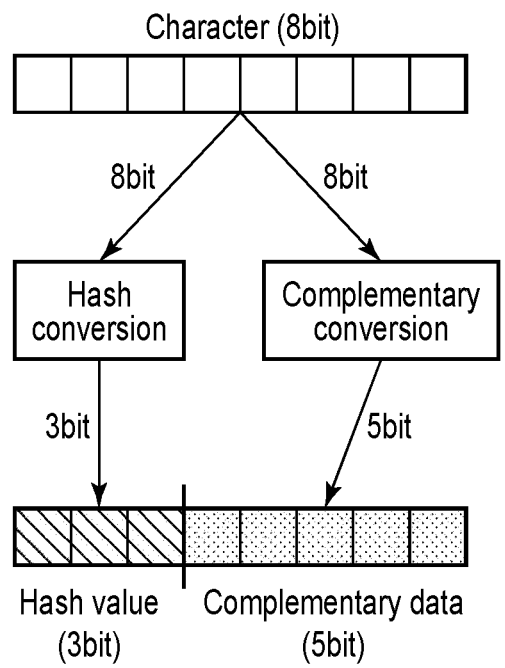
FIG. 4 is a diagram illustrating an outline of hash conversion and complementary data conversion in the first embodiment.
FIG. 5 is a diagram illustrating an example of the hash conversion according to the first embodiment.
FIG. 6 is a diagram illustrating an example of the complementary data conversion according to the first embodiment.

Here, FIG. 4 illustrates an outline of the hash conversion and complementary data conversion described above. In the example illustrated in FIG. 4, it is illustrated that the character (data) is represented by 8 bits (1 byte), the 8-bit character (data) is converted into a 3-bit hash value, and the 8-bit character is converted into 5-bit complementary data.

Note that FIG. 5 illustrates an example of the hash conversion. Here, it is assumed that a character to be converted into a hash value is represented by 8 bits of "D0 D1 D2 D3 D4 D5 D6 D7". Note that each of D0 to D7 corresponds to one (0 or 1) of 8 bits constituting a character.

When the hash conversion is applied to such characters, it is assumed that a 3-bit hash value of "H0 H1 H2" illustrated in FIG. 5 is generated. Note that each of H0 to H2 corresponds to one of 3 bits constituting the hash value.

Specifically, "H0 (the first 1 bit of the hash value)" is calculated (determined) by the exclusive OR of "D1", "D2", and "D3" that constitute a character. In addition, "H1 (the second 1 bit of the hash value)" is calculated (determined) by the exclusive OR of "D4", "D5", and "D6" that constitute a character. Similarly, "H2 (the last 1 bit of the hash value)" is calculated (determined) by the exclusive OR of "D0", "D4", and "D7" that constitute a character.

As a result, the character represented by 8 bits of "D0 D1 D2 D3 D4 D5 D6, D7" can be converted into a 3-bit hash value "H0 H1 H2". Note that the hash value reflects the values of all the bits D0 to D7 that constitute the character.

Meanwhile, FIG. 6 illustrates an example of the complementary data conversion. As described above, it is assumed that when a character is represented by 8 bits of "D0 D1 D2 D3 D4 D5 D6 D7" and complementary data conversion is applied to such a character, a 5-bit hash value of "I0 I1 I2 I3 I4" illustrated in FIG. 6 is generated. Note that each of I0 to I4 corresponds to one of 5 bits constituting the complementary data.

Specifically, "I0 (the first 1 bit of the complementary data)" is calculated (determined) by the exclusive OR of "D4" and "D7" that constitute a character. Also, "I1 (the second 1 bit of the complementary data)" is the same as "D2" that constitutes the character. In addition, "I2 (the third 1 bit of the complementary data)" is the same as "D3" that constitutes the character. In addition, "I3 (the fourth 1 bit of the complementary data)" is the same as "D6" that constitutes the character. Similarly, "I4 (the last 1 bit of the complementary data)" is the same as "D7" that constitutes the character.

As a result, the character represented by 8 bits of "D0 D1 D2 D3 D4 D5 D6 D7" can be converted into a 5-bit complementary data "I0 I1 I2 I3 I4".

Here, the case where the total bit width (that is, the bit width of the converted character data) of the hash value and the complementary data converted (generated) from the character matches the bit width of the character has been described, but when each of the hash value and the complementary data is generated with a bit width smaller than the character, the total bit width of the hash value and the complementary data may be larger than the bit width of the character.

Referring back to FIG. 3, the hash conversion unit 12 outputs the hash value and the complementary data (converted character data) converted from each of the characters included in the input character string to the dictionary buffer 11. This converted character data is stored in the dictionary buffer 11 as the past converted character data. Further, the converted character data stored in the dictionary buffer 11 in this way is output to the second inverse hash conversion unit 18.

Note that the converted character data is stored in the dictionary buffer 11 for each character included in the input character string, but the number of converted character data stored in the dictionary buffer 11 is limited to a predetermined value according to a size of the area allocated to the dictionary buffer 11. In other words, the dictionary buffer 11 is configured to store a certain number of converted character data. Therefore, when a certain number of converted character data is already stored and new converted character data is stored in the dictionary buffer 11, the old converted character data is discarded or overwritten.

Further, the hash conversion unit 12 outputs consecutive hash values (3 bits) converted from each of the characters included in the input character string to the hash full search unit 13.

Here, all the hash values stored in the dictionary buffer 11 are output from the dictionary buffer 11 to the hash full search unit 13, and the hash full search unit 13 determines whether or not each of the consecutive hash values output from the hash conversion unit 12 and each of the hash values output from the dictionary buffer 11 match. In this case, the hash full search unit 13 performs a comprehensive match determination (comparison) that searches all hash values that match each of the hash values output from the hash conversion unit 12 from the hash values output from the dictionary buffer 11.

As described above, since the dictionary buffer 11 stores the converted character data (hash value and complementary data) obtained by converting the characters included in the character string input in the past in the input order (that is, the consecutive hash values are output from the dictionary buffer 11), the hash full search unit 13 can search for the consecutive hash values (that is, of the consecutive hash values output from the dictionary buffer 11, parts where at least part of the consecutive hash values output from the hash conversion unit 12 match) output from the dictionary buffer 11 that match at least part of the consecutive hash values output from the hash conversion unit 12 based on the result of the above-described match determination. Note that the "matching at least part of the consecutive hash values output from the hash conversion unit 12" means that a predetermined number or more of the hash values (characters) among the consecutive hash values match in the same order as the consecutive hash values output from the hash conversion unit 12.

The consecutive hash values searched in this way are considered to be hash values corresponding to a character string (that is, a match candidate) that is highly likely to match the input character string. Therefore, the hash full search unit 13 outputs a pointer indicating the position of the searched consecutive hash values in the dictionary buffer 11 to the dictionary data selection unit 14.

Note that the pointer indicating the position of the consecutive hash values searched by the hash full search unit 13 in the dictionary buffer 11 can be determined by the order in which the hash values are output from the dictionary buffer 11. In addition, the pointer indicating the position of the consecutive hash values in the dictionary buffer 11 is, for example, an address of the dictionary buffer 11 in which the first hash value of the consecutive hash values is stored.

In addition, when a plurality of consecutive hash values (parts where a predetermined number or more of hash values match) are found by the hash full search unit 13, pointers (a plurality of pointers) for each of the plurality of consecutive hash values are output from hash full search unit 13 to dictionary data selection unit 14.

Here, all the converted character data (hash value and complementary data) stored in the dictionary buffer 11 are output from the dictionary buffer 11 to the dictionary data selection unit 14, and the dictionary data selection unit 14 selects consecutive converted character data (consecutive hash values and a plurality of pieces of complementary data corresponding to the consecutive hash values) from the converted character data output from the dictionary buffer 11 based on the pointer output from the hash full search unit 13.

Note that the pointer output from the hash full search unit 13 indicates, for example, the position (address) in the dictionary buffer 11 in which the first hash value of the consecutive hash values searched by the hash full search unit 13 is stored as described above, but the dictionary data selection unit 14 selects a number of consecutive converted character data corresponding to the maximum matching length from the position indicated by the pointer. Note that the maximum matching length (corresponding number) is, for example, the number of characters included in the input character string, but may be the number of characters other than the number of characters included in the input character string. Further, although the case where the number of consecutive converted character data corresponding to the maximum matching length is selected from the position indicated by the pointer is described here, for example, only a converted character (that is, parts where the consecutive hash values converted by the hash conversion unit 12 match) including the consecutive hash values searched by the hash full search unit 13 may be selected.

The dictionary data selection unit 14 outputs the selected consecutive converted character data (converted character data string) to the first inverse hash conversion unit 15 together with the pointer output from the hash full search unit 13.

Note that the case where all the converted character data is output from the dictionary buffer 11 to the dictionary data selection unit 14, and the dictionary data selection unit 14 selects the converted character data based on the pointer output from the hash full search unit 13 is described, but a configuration in which the pointer may be output from the hash full search unit 13 to the dictionary buffer 11, and the converted character data may be output from the dictionary buffer 11 to the first inverse hash conversion unit 15 based on the pointer is possible. In the case of such a configuration, the dictionary data selection unit 14 may be omitted.

The first inverse hash conversion unit 15 applies the inverse hash conversion to each of the consecutive converted character data output from the dictionary data selection unit 14 (that is, executes the inverse hash conversion processing). In the inverse hash conversion, the hash values included in the converted character data are converted into characters by using the complementary data included in the converted character data as described above. As a result, the first inverse hash conversion unit 15 converts the consecutive converted character data output from the dictionary data selection unit 14 into a character string (hereinafter, referred to as an inverse conversion character string) including consecutive characters.

Here, FIG. 7 illustrates an outline of the inverse hash conversion. In the example illustrated in FIG. 7, it is illustrated that a 3-bit hash value is converted into an 8-bit character (data) by using the 5-bit complementary data described in FIG. 4 and the like described above.

Note that FIG. 8 illustrates an example of the inverse hash conversion. FIG. 8 illustrates an example of converting the hash value described in FIG. 5 into characters by using the complementary data described in FIG. 6.

Specifically, when a character is represented by 8 bits of "D0 D1 D2 D3 D4 D5 D6 D7" as described above, "D0" is calculated by the exclusive OR of "H2" that constitutes the hash value and "I0" that constitutes the complementary data. Further, "D1" is calculated by the exclusive OR of "H0" that constitutes the hash value and "I1" and "I2" that constitute the complementary data. Further, "D2" is the same as "I1" that constitutes the complementary data. In addition, "D3" is the same as "I2" that constitutes the complementary data. Further, "D4" is calculated by the exclusive OR of "I0" and "I4" that constitute the complementary data. Further, "D5" is calculated by the exclusive OR of "H1" that constitutes the hash value and "I0", "I3" and "I4" that constitute the complementary data. In addition, "D6" is the same as "I3" that constitutes the complementary data. Further, "D7" is the same as "I4" that constitutes the complementary data.

As a result, by using the 5-bit complementary data "I0 I1 I2 I3 I4", the 3-bit hash value "H0 H1 H2" can be converted into the 8-bit character "D0 D1 D2 D3 D4 D5 D6 D7".

Referring back to FIG. 3, the first inverse hash conversion unit 15 outputs the inverse conversion character string converted from the consecutive converted character data to the dictionary comparison unit 16 together with the pointer output from the dictionary data selection unit 14 together with the converted character data.

When a plurality of pointers are output from the hash full search unit 13 as described above, the dictionary data selection unit 14 outputs the consecutive converted character data for each pointer, and the first inverse hash conversion unit 15 outputs a plurality of inverse conversion character strings for each consecutive converted character data. In this case, the first inverse hash conversion unit 15 operates with the conversion throughput based on the number of converted character data strings (that is, the number of matching candidates) output from the dictionary data selection unit 14×the maximum matching length (that is, the number of converted character data in the converted character data string).

The dictionary comparison unit 16 acquires (inputs) an input character string, and compares the inverse conversion character string output from the first inverse hash conversion unit 15 with the input character string. As a result, the dictionary comparison unit 16 determines matching characters in the input character string and the inverse conversion character string, and acquires a matching length indicating the length of the matching characters.

The dictionary comparison unit 16 outputs the acquired matching length to the maximum matching length determination unit 17 together with the pointer output from the first inverse hash conversion unit 15 together with the inverse conversion character string. When a plurality of inverse conversion character strings are output from the first inverse hash conversion unit 15, the matching length and the pointer are output for each of the inverse conversion character strings.

The maximum matching length determination unit 17 determines the maximum matching length from the matching length output for each inverse conversion character string as described above. The maximum matching length determination unit 17 selects the matching length determined as the maximum matching length and the pointer output from the dictionary comparison unit 16 together with the matching length, and outputs the selected matching length and pointer as matched character data.

Further, as described above, the converted character data stored in the dictionary buffer 11 is output to the second inverse hash conversion unit 18. The second inverse hash conversion unit 18 applies the inverse hash conversion to the converted character data. Since the inverse hash conversion applied to the converted character data by the second inverse hash conversion unit 18 is the same as the inverse hash conversion in the first inverse hash conversion unit 15 described above, a detailed description thereof will be omitted here.

Since the dictionary buffer 11 outputs the converted character data (that is, consecutive converted character data) corresponding to each of the plurality of characters included in the input character string to the second inverse hash conversion unit 18, the second inverse hash conversion unit 18 outputs the input character string (corresponding character string) as mismatched character data by applying the inverse hash conversion to each of the consecutive converted character data.

As described above, the matched character data and the mismatched character data are output from the character string search device 10 according to the first embodiment. The matched character data and the mismatched character data are output according to the throughput required for the character string search device 10 (compression device 2e).

Further, according to the configuration illustrated in FIG. 3, all of the input character strings are output as mismatched character data. The latter stage of the character string search device 10 may be provided with, for example, a selector for selecting the above-described matched character data (matching length and pointer) and mismatched character data (input character string), or the like.

According to this, for example, when the matched character data is output from the maximum matching length determination unit 17 (that is, the input character string is replaced with the matched character data), the matched character data is selected by the selector, and the matched character data is passed to the above-described entropy coding device. On the other hand, for example, when there are no consecutive hash values in the dictionary buffer 11 that matches at least a part of the consecutive hash values output from the hash conversion unit 12, the input character string cannot be replaced with the matched character data, but in this case, the mismatched character data is selected by the selector, and the mismatched character data is passed to the entropy coding device.

Although the above selector is assumed to be provided outside the character string search device 10, the selector may be provided inside the character string search device 10. That is, the character string search device 10 according to the first embodiment may be configured to output either the matched character data or the mismatched character data depending on whether or not the input character string is replaced with the matched character data. Further, for example, when the matched character data is output from the maximum matching length determination unit 17 (that is, the input character string is replaced with the matched character data), the character string search device 10 may be configured so that the processing of the second inverse hash conversion unit 18 is omitted.

The entropy encoding device provided in the compression device 2e together with the character string search device 10 performs entropy encoding on the above-described matched character data and mismatched character data. The result of the entropy coding (that is, compressed data based on the matched character data and the mismatched character data) is written to the NAND flash memory 3. Note that the compressed data written to the NAND flash memory 3 may be provided with, for example, error correction parity (ECC parity).

Here, the compression device 2e (character string search device 10 and entropy coding device) has been described. On the other hand, when the read command is issued from the host, the decompression device 2f executes the processing on the compressed data. When the read command is issued from the host, the data read from the NAND flash memory 3 based on the read command is subjected to the predetermined processing such as the error correction processing and the randomization cancellation processing, and the like, and then is input to the decompression device 2f by the CPU 2b as the compressed data. Then, the decompression device 2f executes entropy decoding and dictionary decoding on the input compressed data.

As described above, in the first embodiment, hash values (first hash value) corresponding to each of a plurality of consecutive characters included in a character string (first character string) input in the past, and complementary data (first complementary data) for converting the hash values into characters are stored in the dictionary buffer 11, each of a plurality of consecutive characters included in the input character string (second character string) is converted into a hash value (second hash value) corresponding to the character and complementary data (second complementary data) for converting the hash value into a character, the consecutive hash values that match at least part of the converted consecutive hash values are searched from the dictionary buffer 11, and a pointer indicating the position in the dictionary buffer 11 in which the consecutive hash values are stored is output. Further, in the first embodiment, the consecutive hash value and the plurality of pieces of complementary data corresponding to each of the consecutive hash values are selected from the dictionary buffer 11 based on the pointer, and the selected consecutive hash values are converted into an inverse conversion character string (third character string) by using the selected plurality of pieces of complementary data. Further, in the first embodiment, the matching length indicating the length of the matching character is acquired by comparing the input character string and the inverse conversion character string, and the matching length is output together with the pointer described above.

In the first embodiment, such a configuration can realize high search performance on a small circuit scale.

Here, the circuit scale and search performance of the character string search device 10 according to the first embodiment will be described with reference to a comparative example with respect to the character string search device according to the first embodiment.

First, an outline of a character string search device of a first comparative example will be described. FIG. 9 illustrates an example of a configuration of a device (hereinafter referred to as the character string search device in the first comparative example) that performs dictionary coding using a method called "full search" (hereinafter referred to as "full search" method).

As illustrated in FIG. 9, the character string search device 100 of the first comparative example includes a dictionary buffer 101, a character string full search unit 102, and a maximum matching length determination unit 103.

Unlike the dictionary buffer 11 in the first embodiment, the dictionary buffer 101 in the character string search device 100 of the first comparative example stores (each of a plurality of consecutive characters included in) a character string input in the past.

The character string full search unit 102 performs a comprehensive match determination (comparison) that searches all the characters that match each of the characters included in the input character string from the characters included in the character string output from the dictionary buffer 101.

The maximum matching length determination unit 103 specifies a part (character string including consecutive characters) having the maximum matching length among the parts where a predetermined number or more of characters match in the same order as the consecutive characters included in the input string, and outputs the matching length and the pointer indicating the position in the dictionary buffer 101 in which the character string is stored as the matched character data.

Note that the input character string is stored in the dictionary buffer 101 and is output as mismatched character data from the dictionary buffer 101.

Here, assuming that each of the plurality of characters included in the input character string (and the character string stored in the dictionary buffer 101) is represented by 8 bits (1 byte) as described in the first embodiment, in order to compare the characters included in the input string with the characters included in the string stored in the dictionary buffer 101, the character string full search unit 102 described above includes an 8-bit comparator for the number of "input data size (that is, the number of characters included in the input character string)×dictionary data size (that is, the number of characters included in the character string stored in the dictionary buffer 101)". In such a configuration, the circuit scale of the character string search device 100 in the first comparative example increases in proportion to both the input data size (input throughput) and the dictionary data size.

In general, the larger the size of the area allocated to the dictionary buffer 11, the higher the coding performance because it is possible to search for a character string in which more characters match (that is, the matching length is longer). However, increasing the size of the area allocated to the dictionary buffer 11 causes an increase in the circuit scale.

On the other hand, in the first embodiment, the hash value corresponding to the character included in the input character string is compared with the hash value stored in the dictionary buffer 11, and the number of bits of the hash value is, for example, 3 bits smaller than the number of character bits (for example, 8 bits). According to this, since a 3-bit comparator can be used to compare hash values in the first embodiment, the circuit scale of the hash full search unit 13 included in the character string search device 10 according to the first embodiment is smaller than the character string full search unit 102 included in the character string search device 100 of the first comparative example described above. Since the above-described comparator has a large influence on the circuit scale, as a result, the circuit scale of the character string search device 10 according to the first embodiment is also smaller than that of the character string search device 100 of the first comparative example.

In addition, in order to avoid the increase in the circuit scale as in the character string search device 100 of the first comparative example described above, a device (hereafter, referred to as the character string search device in the second comparative example) that performs a character string search (dictionary coding) by a method using a hash table (hereinafter, referred to as "hash table" method) has been known.

FIG. 10 illustrates an example of a configuration of a character string search device 110 of a second comparative example. As illustrated in FIG. 10, the character string search device 110 of the second comparative example includes a dictionary buffer 111, a hash table unit 112, a hash conversion unit 113, a hash reading unit 114, a dictionary data selection unit 115, a dictionary comparison unit 116, and a maximum matching length determination unit 117.

Similar to the first comparison example, the dictionary buffer 111 in the character string search device 110 of the second comparative example stores (each of a plurality of consecutive character string included in) a character string input in the past. Note that the input character string is stored in the dictionary buffer 11 and is output as mismatched character data from the dictionary buffer 111.

A pointer indicating a position in the dictionary buffer 111 in which the character string is stored, using the hash value corresponding to the character string (the predetermined number of characters) input in the past as an index is written to the hash table unit 112.

The hash conversion unit 113 converts an input character string (input data) of several bytes into a hash value, and outputs the hash value to the hash table unit 112 and the hash reading unit 114.

The pointer indicating the position in the dictionary buffer 111 that stores the input character string of several bytes converted into the hash value output from the hash conversion unit 113 to the hash table unit 112 is written to a table entry of the hash table unit 112 referenced by the index specified by the hash value. When the pointer is already held in the table entry using the hash value output from the hash conversion unit 113 in the hash table unit 112 as the index, the latest pointer is held in the table entry. Further, the hash table unit 112 may hold a plurality of pointers having one hash value as an index.

The hash reading unit 114 reads all the pointers (that is, the pointers in the table entry) written to the hash table unit 112 using the hash value output from the hash conversion unit 113 as the index.

The dictionary data selection unit 115 selects the character string (dictionary data) stored in the dictionary buffer 111 according to the pointer read from the hash table unit 112 by the hash reading unit 114.

The dictionary comparison unit 116 inputs an input character string, and compares the character string selected by the dictionary data selection unit 115 with the input character string. As a result, the dictionary comparison unit 116 acquires the matching length indicating the length of the matching character in the input character string and the character string selected by the dictionary data selection unit 115.

The maximum matching length determination unit 117 determines the maximum matching length from the matching lengths acquired by the dictionary comparison unit 116 for each character string selected by the dictionary data selection unit 115, and outputs the matching length determined to be the maximum matching length and the pointer corresponding to the matching length (a pointer indicating the position of the character string having the maximum matching length in the dictionary buffer 111) as the matched character data.

Here, when comparing the character string search device 100 of the first comparison example ("full search" method) and the character string search device 110 of the second comparison example ("hash table" method), from the point of view of generating the matching length between the input string and the string in the dictionary buffer, it can be said that the character string full search unit 102 of the first comparative example and the dictionary comparison unit 116 of the second comparative example correspond to each other.

However, in the character string full search unit 102 of the first comparison example, it is necessary to execute the search (comparison) processing on all the characters included in the character string stored in the dictionary buffer 101, but in the dictionary comparison unit 116 of the second comparison example, the read processing (search processing) is executed only for the pointer indicated by the hash value among the pointers written in the hash table unit 112. That is, since the target (candidate) of the search processing is narrowed down in the character string search device 110 of the second comparative example, the number of comparators provided in the dictionary comparison unit 116 of the second comparative example may be smaller than the number of comparators provided in the character string full search unit 102 of the first comparative example. Therefore, the character string search device 110 in the second comparative example may reduce the circuit scale (the number of comparators) and realize the efficient operation as compared with the character string search device 100 in the first comparative example.

The character string search device 110 of the second comparative example needs to further include, for example, the hash table unit 112 as compared with the configuration of the character string search device 100 of the first comparative example, but the size of the hash table unit 112 itself is a circuit scale that is proportional to log2 (a logarithm of a base 2) of the dictionary data size. Specifically, the hash table unit 112 has a circuit scale corresponding to the product of the pointer bit width, which is the logarithm of the dictionary data size, and the number of pointers. In this case, by limiting the number of pointers, the character string search device 110 of the second comparative example may have a smaller circuit scale than the character string search device 100 of the first comparative example.

On the other hand, the character string search device 100 of the first comparative example ("full search" method) described above has a configuration in which the data history (character string input in the past) is searched without omission, and therefore, the search performance is high. On the other hand, the character string search device 110 in the second comparison example ("hash table" method) is configured to narrow down the candidates in the dictionary buffer 111 using the hash value, and the search performance of comparing the "full search" method is reduced. Specifically, the hash collision may be highly likely to occur in the "hash table" method, but it can be said that when the hash collision occurs, an appropriate character string cannot be selected from the dictionary buffer 111, and the search performance is compromised compared to the "full search" method.

When the hash collision, which is the cause of the deterioration of the search performance in such a "hash table" method, may be mitigated by increasing the bit width of the hash value, but the bit width is increased (increased), the number of table entries in the hash table unit 112 increases by a power factor of 2 for the increment of the bit width, so the circuit scale of the hash table unit 112 increases dramatically.

Further, in order to cope with the hash collision, it is conceivable to write a plurality of pointers in association with one index (hash value) in the hash table unit 112, but even in such a case, the size of the hash table 112 increases, so it becomes a factor of the increase in the circuit scale.

On the other hand, in the first embodiment, since the hash value and the complementary data corresponding to each of the plurality of consecutive characters included in the character string input in the past are stored in the dictionary buffer 11, and the dictionary buffer 11 is configured to search (search) for a hash value that matches the hash value corresponding to each of the characters included in the input character string, compared with the character string search device 110 in the second comparison example ("hash table" method) that uses the hash value as an index, the effect of hash collision can be mitigated. As a result, the character string search device 10 according to the first embodiment can realize higher search performance than the character string search device 110 of the second comparative example.

That is, according to the first embodiment, the high search performance exceeding the "hash table" method can be realized on the circuit scale smaller than that of the "full search" method.

The circuit scale of the character string search device 10 according to the first embodiment and the character string search device 110 of the second comparative example will also be briefly described. First, although the format of the stored data is different between the dictionary buffer 11 and the dictionary buffer 111, the size of the data is the same, so the circuit scale of the dictionary buffer 11 and the circuit scale of the dictionary buffer 111 are equivalent. Further, when the number of match candidates (converted character data selected by the dictionary data selection unit 14 and the character string selected by the dictionary data selection unit 115) selected by the dictionary data selection unit 14 and the dictionary data selection unit 115 is the same, the circuit scale of the dictionary data selection unit 14, the dictionary comparison unit 16, and the maximum matching length determination unit 17 of the character string search device 10 according to the first embodiment and the circuit scale of the dictionary data selection unit 115, the dictionary comparison unit 116, and the maximum matching length determination unit 117 of the character string search device 110 of the second comparative example are the same. Further, the hash conversion unit 12, the first inverse hash conversion unit 15, and the second inverse hash conversion unit 18 of the character string search device 10 according to the first embodiment may be constituted by circuits having an extremely small scale as compared with other units (other circuits).

Therefore, the magnitude of the circuit scale between the character string search device 10 according to the first embodiment and the character string search device 110 of the second comparative example depends on the comparison result of the circuit scale of the hash full search unit 13 illustrated in FIG. 3 and the circuit scale of the hash table unit 112 and the hash reading unit 114 illustrated in FIG. 10.

Here, in the first embodiment, it has been described that a 3-bit hash value is used, but in this case, when a part (consecutive hash values of 4 or more characters) where for example, 4 or more characters are continued) characters match is searched by the hash full search unit 13 as a match candidate, the matching candidate will be searched (selected) with a hash value of 3 bits×4 characters=12 bits. Assuming that the bit width of the hash value written to the hash table unit 112 in the second comparative example is used as a simple index for aligning the search performance, in the hash table unit 112, it is conceivable to use a 12-bit hash value converted from an input character string including 4 characters as an index.

Figure 11:
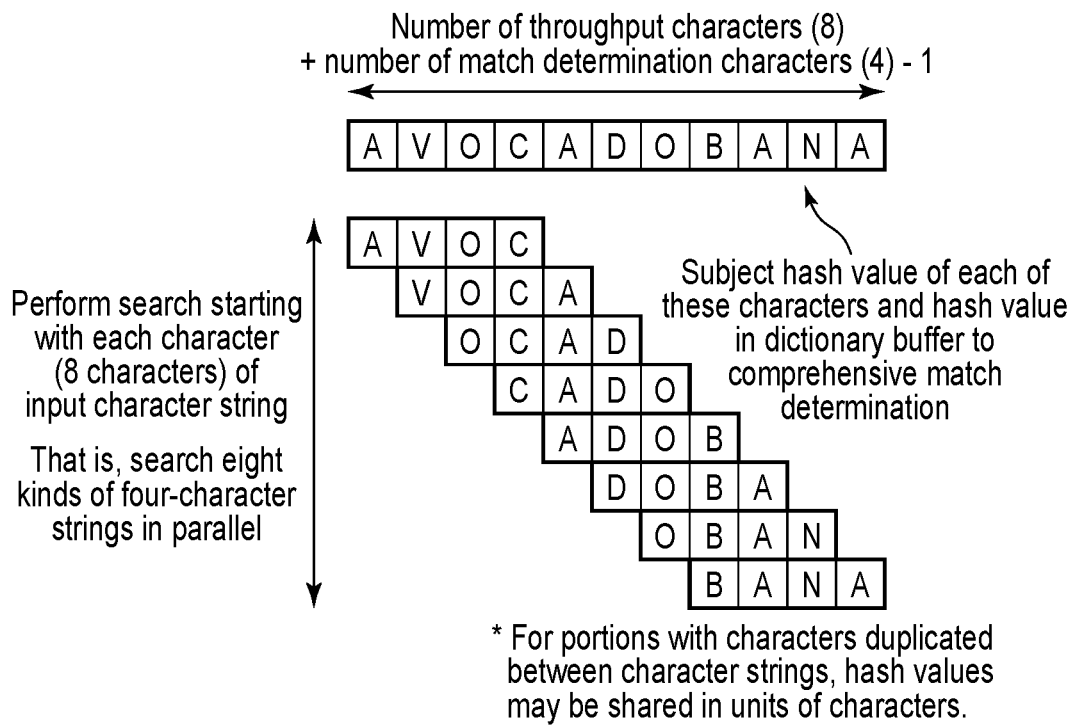
FIG. 11 is a diagram for describing a circuit scale according to the first embodiment and the second comparison example.

Hereinafter, in this case, the circuit scales of the hash full search unit 13 and the hash table unit 112 and the hash reading unit 114 are compared. However, here, as illustrated in FIG. 11, it is assumed that the character string search starting with each character of the input character string is performed in parallel. In this case, the hash values of each character in the character string including the number of characters (the number of throughput characters (for example, 8)+the number of match determination characters (for example, 4)−1) and the hash value in the dictionary buffer 11 are subjected to the comprehensive match determination. As a result, for example, when the input character string includes eight characters, as illustrated in FIG. 11, eight kinds of four character strings are searched in parallel. Note that for characters that are duplicated between the searched character strings, the hash values of the characters may be shared.

This configuration is suitable for the hash full search method (the method adopted in the character string search device 10 according to the first embodiment), but is also used in the hash table method corresponding to the input throughput of two or more characters.

In the following description, it is assumed that the dictionary size is 4096 bytes and the throughput (throughput character number) of the input character string is 8 characters (8 bytes). Further, as described above, it is assumed that the number of characters in the match determination character string (that is, the minimum number of characters searched for as a match candidate) is 4.

First, the circuit scale of hash full search unit 13 will be described. Here, only the main components of hash full search unit 13 are considered. As the main components of the hash full search unit 13, there are a comparer that determines the match between the hash value obtained by hash-converting the input character string by the hash conversion unit 12 and the hash value of the dictionary buffer 11, an AND element that integrates the hash match result in units of characters into the hash match flag in units of character strings, and a circuit (hereinafter, referred to as a pointer conversion circuit) that converts the hash match flag in units of characters into the pointer.

The comparator is constituted by an exclusive OR (XOR) element, and the number of the comparators is calculated by "dictionary size*(the number of throughput characters+ match determination character string character number−1) *character unit hash bit width". Note that the hash bit width in units of characters in the first embodiment is 3 bits. Assuming that the dictionary size is 4096 bytes and the number of throughput characters is 8 (characters) as described above, 135168 is calculated as the number of comparators. Further, assuming that the number of gates in one comparator (per bit) is, for example, four gates, the total number of gates in all the comparators is 4×135168=540672.

The number of AND elements for character string integration is calculated by "dictionary size*number of throughput characters*(the number of matching determination character string characters−1)". Here, 98304 is calculated as the number of AND elements for the character string integration. Assuming that the number of gates of an AND element (per bit) for one character string integration is, for example, one gate, the total number of gates of an AND element for all the character string integration is 1×98304=98304.

The pointer conversion circuit is constituted by an OR element and a MUX element, and the number of pointer conversion circuits is calculated by "dictionary size*the number of throughput characters". Here, 32768 is calculated as the number of pointer conversion circuits. Assuming that the number of gates in one pointer conversion circuit (per bit) is, for example, four gates, the total number of gates in all the pointer conversion circuits is 4×32768=131072.

Assuming that the circuit scale of the hash full search unit 13 is represented by the total number of gates of the main components (comparator, AND element for character string integration, and pointer conversion circuit) of the hash full search unit 13, the circuit scale of the hash full search unit 13 may be expressed as 540672 (total number of gates of comparator)+98304 (total number of gates of AND element for character string integration)+131072 (total number of gates of pointer conversion circuit)=770048.

Next, the circuit scales of the hash table unit 112 and the hash reading unit 114 will be described. Here, only the main components of the hash table unit 112 and the hash reading unit 114 are considered.

The hash table unit 112 requires a flip-flop that constitutes a table, and when one pointer is stored for each entry (hash table entry) of the hash table unit 112, the total number of bits is determined by the number of hash table entries and the size of the dictionary pointer to be stored. That is, the number of flip-flops (table F/F) is calculated by "the number of hash table entries*dictionary pointer size". Assuming that the number of hash table entries is 4096 and the dictionary pointer size is 12 bits, 49152 is calculated as the number of flip-flops. Further, assuming that the number of gates in one flip-flop (per bit) is, for example, eight gates, the total number of gates in all flip-flops is 8×49152=393216.

Since each hash table entry is accompanied by a write control (table write control) circuit and is processed as a match determination with a fixed value (index of the hash table entry) for the hash value, the number of the write control circuits is calculated by "the number of hash table entries*hash bit width". Here, as described above, it is assumed that the 12-bit hash value converted from the input character string including 4 characters is used as the index (that is, the hash bit width is 12). 49152 is calculated as the number of write control circuits. Assuming that the number of gates in one write control circuit (per bit) is, for example, one gate, the total number of gates in all write control circuits is 1×49152=49152.

The hash reading unit 114 is constituted by a MUX circuit (table read MUX) to read the pointer value according to the hash value, and the number of the MUX circuits is calculated by "the number of hash table entries*the number of throughput characters*the dictionary pointer size". Here, 393216 is calculated as the number of MUX circuits. Assuming that the number of gates in one MUX circuit (per bit) is, for example, 3 gates, the total number of gates in all MUX circuits is 3×393216=1179648.

Assuming that the circuit scales of the hash table unit 112 and the hash reading unit 114 are represented by the total number of gates of the main components (flip-flop, write control circuit, and MUX circuit) of the hash table unit 112 and the hash reading unit 114, the circuit scales of the hash table unit 112 and the hash reading unit 114 can be represented by 393216 (total number of flip-flop gates)+49152 (total number of write control circuits)+1179648 (total number of MUX circuit gates)=1622016.

Comparing the circuit scales (total number of gates) of the hash table unit 112 and the hash reading unit 114 with the circuit scale (total number of gates) of the hash full search unit 13 described above, it can be seen that the circuit scale of hash full search unit 13 is smaller than the circuit scales of the hash table unit 112 and the hash reading unit 114. That is, for example, when configured to have the same level of search performance, it can be said that the first embodiment is superior to the second comparative example in terms of the circuit scale.

The magnitude relationship between the character string search device 10 according to the first embodiment and the character string search device 110 of the second comparative example varies depending on the bit width of the hash value, the minimum number of matching characters to be searched for as a match candidate, and the like, but when the search performance of the character string search device 110 of the second comparative example is improved as compared with the character string search device 10 according to the first embodiment (for example, the bit width of the hash value is increased, or the like), it is considered that the superiority of the character string search device 10 according to the first embodiment regarding the circuit scale is improved. Although detailed explanation is omitted, for example, when the hash bit width is 16 bits (the bit width of the hash value in each character is 4 bits) and the number of hash table entries is 65536, the circuit scale (total number of gates) of the hash full search unit 13 is 950272, and the circuit scales (total number of gates) of the hash table unit 112 and the hash reading unit 114 is 26214400, which improves the superiority of the first embodiment regarding the circuit scale.

Further, in the first embodiment, the consecutive hash values converted from the input character string by the hash conversion unit 12 and the plurality of pieces of complementary data corresponding to each of the consecutive hash values are stored in the dictionary buffer 11, and the hash value stored in the dictionary buffer 11 is converted into an input character string using the complementary data and output. According to such a configuration, even if the input character string is not stored in the dictionary buffer 11 as described above, the mismatched character data (input character string) used as the result of the dictionary coding can be output to the latter stage.

Further, in the first embodiment, it is described that the number of bits (for example, 3 bits) of the hash value stored in the dictionary buffer 11 and the hash value converted by the hash conversion unit 12, respectively, is smaller than the number of character bits (for example, 8 bits), but the total number of bits of the hash value and the complementary data corresponding to the hash value may be the same as the number of bits of the character. According to such a configuration, even if the converted character data obtained by adding the complementary data to the hash value is stored in the dictionary buffer 11, since it is not necessary to increase, for example, the size of the dictionary buffer 11 as compared with the dictionary buffer 101 in the first comparative example and the dictionary buffer 111 in the second comparative example, it is possible to contribute to the suppression of the circuit scale in the character string search device 10 according to the first embodiment.

Further, in the first embodiment, when a plurality of consecutive hash values (that is, a plurality of match candidates) that match at least part of the consecutive hash values converted by the hash conversion unit 12 are found, the maximum matching length of the matching lengths for each of the plurality of consecutive hash values is output together with the pointer indicating the position in the dictionary buffer 11 in which the consecutive hash values having the maximum matching length are stored. In the first embodiment, with such a configuration, the portion of the input character string having a larger matching length can be replaced with matched character data (relative reference), so the coding efficiency can be improved.

In the first embodiment, although it is described that the hash values corresponding to each of the plurality of characters included in the character string input in the past and the complementary data corresponding to the hash value are stored in (area allocated to) the dictionary buffer 11, different areas may be allocated to the hash value and the complementary data.

Specifically, the hash value stored in the dictionary buffer 11 in the first embodiment is output to the hash full search unit 13, the dictionary data selection unit 14, and the inverse hash conversion unit 18 (that is, it is frequently read by the hash full search unit 13, the dictionary data selection unit 14, and the inverse hash conversion unit 18), so it is preferable that data is stored in an area that can be read at high speed. In this case, the hash value may be stored in, for example, a flip-flop circuit (that is, the area of the flip-flop circuit is allocated to the hash value) or the like. On the other hand, since the complementary data is read less frequently than the hash value, the complementary data may be stored in a memory such as SRAM (that is, an area of the memory is allocated). That is, the dictionary buffer 11 in the first embodiment may include an area of a flip-flop circuit for storing a hash value and an area of a memory for storing complementary data.

Second Embodiment

Next, a second embodiment will be described. In the second embodiment, detailed description of the same parts as those of the first embodiment described above will be omitted, and parts different from the first embodiment will be mainly described. Further, a hardware configuration of a memory system in the second embodiment is the same as that in the first embodiment described above, and therefore, will be described with reference to FIG. 1 as appropriate.

A compression device 2e included in a memory system 1 in the second embodiment includes a character string search device and an entropy coding device as in the first embodiment described above, but the character string search device according to the second embodiment will be described below.

Figure 12:
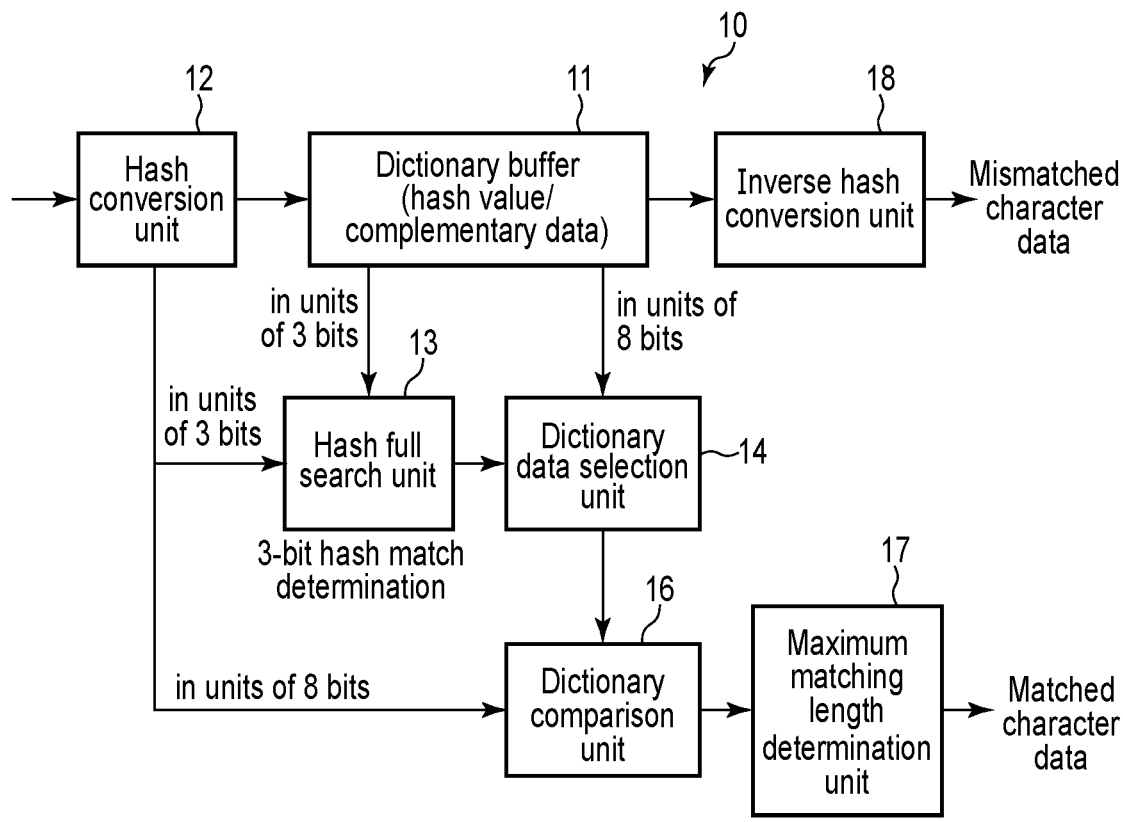
FIG. 12 is a block diagram illustrating an example of a configuration of a character string search device according to the second embodiment.

FIG. 12 is a block diagram illustrating an example of a configuration of the character string search device according to the second embodiment. In FIG. 12, the same parts as those in FIG. 3 described above are designated by the same reference numerals, a detailed description thereof will be omitted, and parts different from those in FIG. 3 will be described.

As illustrated in FIG. 12, a character string search device 10 includes a dictionary buffer 11, a hash conversion unit 12, a hash full search unit 13, a dictionary data selection unit 14, a dictionary comparison unit 16, a maximum matching length determination unit 17, and a second inverse hash conversion unit 18.

That is, the second embodiment is different from the first embodiment in that the first inverse hash conversion unit 15 in the first embodiment described above is omitted. The inverse hash conversion unit 18 illustrated in FIG. 12 corresponds to the second inverse hash conversion unit 18 in the first embodiment described above.

In the second embodiment, unlike the first embodiment described above, the dictionary comparison unit 16 inputs consecutive converted character data (hereinafter referred to as the first converted character data) output from the hash conversion unit 12, and compares the consecutive converted character data output from the dictionary data selection unit 14 (hereinafter referred to as the second converted character data) with the consecutive first converted character data. As a result, the dictionary comparison unit 16 determines the converted character data that matches the consecutive first converted character data and the consecutive second converted character data, and acquires the number of the matching converted character data as the matching length.

The dictionary buffer 11, the hash conversion unit 12, the hash full search unit 13, the dictionary data selection unit 14, the maximum matching length determination unit 17, and the inverse hash conversion unit 18 other than the dictionary comparison unit 16 illustrated in FIG. 12 are as described in the first embodiment, and therefore, a detailed description thereof will be omitted here.

As described above, in the second embodiment, by the configuration in which the consecutive hash values (second hash value) converted from the plurality of consecutive characters included in the input character string and the plurality of pieces of complementary data (first complementary data) corresponding to each of the consecutive hash values are compared with the consecutive hash values (first hash value) output from the dictionary data selection unit 14 and the plurality of pieces of complementary data (second complementary data) corresponding to each of the continuous hash values and the matching length is acquired, it is possible to realize high search performance on a small circuit scale similar to the first embodiment described above.

In the second embodiment, it is assumed that the converted character data is generated so that the hash conversion and the inverse hash conversion are one-to-one reversible conversions. Specifically, for example, when the bit width of the converted character data (total bit width of the hash value and the complementary data) converted from each of the plurality of characters included in the input character string is smaller than the bit width (input bit width) of the character converted into the converted character data, it is not possible to secure a relationship (that is, the relationship in which the characters converted into the converted character data and the characters inversely converted from the converted character data are the same) in which characters and converted character data are one-to-one reversible conversion. Therefore, in the second embodiment, the inversely converted character data is generated so that the bit width of the inversely converted character data and the bit width of the character match. According to such converted character data, it is possible to secure a relationship in which the character and the converted character data are converted in a one-to-one reversible conversion. Even if the bit width of the converted character data converted from each of the plurality of characters included in the input character string is larger than the bit width of the characters, it is possible to secure the relationship of the reversible conversion, but in this case, since the size of the comparator used in the dictionary comparison unit 16 becomes large (that is, the circuit scale becomes large), it is preferable to match the bit width of the converted character data with the bit width of the character.

When the character and the converted character data have a one-to-one reversible conversion relationship in this way, it is possible to obtain an accurate matching length by comparing in the format of converted character data without performing the inverse hash conversion (that is, comparing the inverse conversion character string with the input string) as described in the first embodiment described above.

Further, in the second embodiment, the first inverse hash conversion unit 15 is omitted as compared with the first embodiment, but the reduction rate (reduction width) of the circuit scale due to the omission of the first inverse hash conversion unit 15 is not large. However, in the second embodiment, since the inverse hash conversion processing by the first inverse hash conversion unit 15 is not executed, a secondary effect can be expected that the dictionary comparison processing (that is, a critical path from the dictionary buffer 11 to the dictionary comparison unit 16) is shortened and the delay (hardware-implemented gate delay due to the inverse hash conversion process is reduced.

The dictionary data selection unit 14 selects the number of consecutive conversion character data corresponding to the maximum matching length from the position indicated by the pointer output from the hash full search unit 13, and outputs the selected conversion character data, but in the second embodiment, the dictionary data selection unit 14 may be configured to select and output (that is, not select and output the hash value) complementary data in place of the conversion character data determined to match the hash value (that is, the hash value corresponding to the character included in the input string) output from the hash conversion unit 12 by the hash full search unit 13 among the conversion character data. In the case of such a configuration, it is considered that the matching of the hash values has already been determined by the hash full search unit 13, and it is possible to acquire the matching length only by comparing the complementary data output from the dictionary data selection unit 14 and the complementary data output from the hash conversion unit 12 in the dictionary comparison unit 16.

On the other hand, for the converted character data that has not been determined by the hash full search unit 13 when matching the hash value output from the hash conversion unit 12 of the converted character data, the converted character data is selected and output by the dictionary data selection unit 14, and in the dictionary comparison unit 16, the converted character data output from the dictionary data selection unit 14 and the converted character data output from the hash conversion unit 12 may be compared.

That is, in the second embodiment, the hash full search unit 13 does not select the hash value for the number of characters for which matching is confirmed, and performs only the comparison of the complementary data, and the hash full search unit 13 may be configured to select the hash value and the complementary data for the number of characters for which matching is not confirmed, and perform the comparison of the hash value and the complementary data (that is, the matching length is obtained using the complementary data selected according to the characters for which matching is confirmed and the hash value and complementary data selected according to the characters for which matching is not confirmed).

According to such a configuration, the number of comparators included in the dictionary comparison unit 16 can be reduced, and the circuit scale can be reduced.

Here, in the character string search device 10 according to the second embodiment, it has been described that the dictionary data selection unit 14 may be configured to select and output complementary data instead of the converted character data, but in the first embodiment described above, since it is necessary to execute the inverse hash conversion processing, the dictionary data selection unit 14 needs to select and output the converted character data.

Third Embodiment

Next, a third embodiment will be described. In a third embodiment, detailed description of the same parts as those of the first and second embodiments described above will be omitted, and parts different from the first and second embodiments will be mainly described. Further, a hardware configuration of a memory system in the second embodiment is the same as that in the first embodiment described above, and therefore, will be described with reference to FIG. 1 as appropriate.

A compression device 2e included in a memory system 1 in the third embodiment includes a character string search device and an entropy coding device as in the first embodiment and the second embodiment described above, but the character string search device according to the third embodiment will be described below.

FIG. 13 is a block diagram illustrating an example of a configuration of the character string search device according to the third embodiment. In FIG. 13, the same parts as those in FIGS. 3 and 12 described above are designated by the same reference numerals, a detailed description thereof will be omitted, and parts different from those in FIGS. 3 and 12 will be described.

As illustrated in FIG. 13, a character string search device 10 includes a dictionary buffer 11, a hash conversion unit 12, a hash full search unit 13, a dictionary data selection unit 14, a dictionary comparison unit 16, a maximum matching length determination unit 17, and a data delay unit 19.

That is, the present embodiment is different from the second embodiment in that a second inverse hash conversion unit 18 in the second embodiment described above is omitted and the data delay unit 19 is added.

The data delay unit 19 receives the input character string and holds the input character string according to the throughput required for the character string search device 10. In other words, the data delay unit 19 performs a data delay corresponding to latency until the matched character data is output from the maximum matching length determination unit 17. The data delay unit 19 outputs an input character string as mismatched character data after such a data delay.

Note that the dictionary buffer 11, the hash conversion unit 12, the hash full search unit 13, the dictionary data selection unit 14, the dictionary comparison unit 16, and the maximum matching length determination unit 17 other than the data delay unit 19 illustrated in FIG. 13 are as described in the second embodiment, and therefore, a detailed description thereof will be omitted here.

In the third embodiment, as described above, by the configuration in which the input character string (second character string) is held until the matched character data (matching length and pointer) is output from the maximum matching length determination unit 17 and output, there is a possibility that the circuit scale of character string search device 10 can be further suppressed.

Specifically, when the processing latency of the character string search device 10 is large, the delay circuit included in the data delay unit 19 does not have a smaller circuit scale than the inverse hash conversion unit 18 (second inverse hash conversion unit 18 in the first embodiment) in the second embodiment described above. However, for example, when implementing SRAM or the like in which the number of access data is restricted as the configuration of the dictionary buffer 11, the configuration in which the dictionary buffer 11 outputs mismatched character data as in the first and second embodiments described above may lead to an increase in scale. In such a case, it can be expected that the circuit scale of the character string search device 10 can be suppressed by providing the data delay unit 19 corresponding to the latency without outputting the mismatched character data to the dictionary buffer 11.

Further, in the first and second embodiments described above, since it is necessary to execute the inverse hash conversion process based on the converted character data, it is necessary for the hash conversion unit 12 to generate the conversion character data in consideration of the complexity of the inverse hash conversion processing, the processing delay (the number of gate delay stages), and the like. However, since it is not necessary to execute the inverse hash conversion process in the third embodiment, it is possible to design the converted character data with a higher degree of freedom (that is, to simplify the calculation by the hash conversion unit 12).

Although the detailed description is omitted, the configuration in which the dictionary data selection unit 14 described in the second embodiment described above selects and outputs the complementary data instead of the converted character data may be applied to the third embodiment.

According to at least one embodiment described above, it is possible to provide the character string search device and the memory system capable of realizing high search performance on a small circuit scale.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A character string search device, comprising:
a buffer configured to store, for each character, first hash values corresponding to each of a plurality of consecutive characters included in a first character string previously input and first complementary data corresponding to the first hash values for converting the first hash values into the characters;
a first conversion unit configured to convert each of a plurality of consecutive characters included in a second character string input into second hash values corresponding to the characters and second complementary data corresponding to the second hash values for converting the second hash values into the characters;
a search unit configured to search for consecutive first hash values matching at least part of the converted consecutive second hash values from the buffer, and output a pointer indicating a position in the buffer in which the consecutive first hash values is stored;
a selection unit configured to select consecutive first hash values and a plurality of pieces of first complementary data corresponding to each of the consecutive first hash values from the buffer based on the pointer;
a second conversion unit configured to convert the selected consecutive first hash values into a third character string including consecutive characters using the selected pieces of first complementary data;
a comparison unit configured to compare the second character string with the third character string to acquire a matching length indicating a length of matching characters; and
an output unit configured to output the matching length with the pointer.

2. A character string search device, comprising:
- a buffer configured to store, for each character, first hash values corresponding to each of a plurality of consecutive characters included in a first character string previously input and first complementary data corresponding to the first hash values for converting the first hash values into the characters;
- a first conversion unit configured to convert each of a plurality of consecutive characters included in a second character string input into second hash values corresponding to the characters and second complementary data corresponding to the second hash values for converting the second hash values into the characters;
- a search unit configured to search for consecutive first hash values matching at least part of the converted consecutive second hash values from the buffer, and output a pointer indicating a position in the buffer in which the consecutive first hash values is stored;
- a selection unit configured to select consecutive first hash values and a plurality of pieces of first complementary data corresponding to each of the consecutive first hash values from the buffer based on the pointer;
- a comparison unit configured to compare the converted consecutive second hash values and pieces of second complementary data corresponding to each of the consecutive second hash values with the selected consecutive first hash values and pieces of first complementary data corresponding to each of the consecutive first hash values to acquire a matching length indicating a length of matching characters; and
- an output unit configured to output the matching length with the pointer.

3. The character string search device according to claim 1, further comprising:
- a third conversion unit,
- wherein the converted consecutive second hash values and the pieces of second complementary data corresponding to each of the consecutive second hash values are stored in the buffer, and
- the third conversion unit is configured to convert the consecutive second hash values into the second character string using the pieces of second complementary data stored in the buffer and outputs the second character string.

4. The character string search device according to claim 2, further comprising: a data delay unit configured to hold the input second character string until the matching length and the pointer are output.

5. The character string search device according to claim 2, wherein
the selection unit is configured to
select a plurality of first complementary data corresponding to the consecutive first hash values for the consecutive first hash values matching at least part of the converted consecutive second hash values from the consecutive first hash values selected based on the pointer, and
select a first hash value and first complementary data corresponding to the first hash value for first hash values other than the consecutive first hash values matching at least part of the converted consecutive second hash values from the consecutive first hash values selected based on the pointer, and
the comparison unit is configured to acquire the matching length using the selected pieces of first complementary data and the selected first hash value and first complementary data.

6. The character string search device according to claim 1, wherein the number of bits of each of the first hash value and the second hash value is smaller than the number of bits of the character.

7. The character string search device according to claim 6, wherein a total number of bits of the first hash value and the first complementary data corresponding to the first hash value and a total number of bits of the second hash value and the second complementary data corresponding to the second hash value are each the same as the number of bits of the character.

8. The character string search device according to claim 1, wherein
when the pieces of consecutive first hash values matching at least part of the consecutive second hash values are searched, the comparison unit is configured to acquire a matching length for each of the consecutive first hash values, and
the output unit is configured to output a maximum matching length of the acquired matching lengths with the pointer indicating the position in the buffer in which the consecutive first hash values with the maximum matching length are stored.

9. The character string search device according to claim 1, wherein
the buffer includes a flip-flop circuit and a memory,
the first hash value is stored in the flip-flop circuit, and
the first complementary data is stored in the memory.

10. The character string search device according to claim 2, wherein the number of bits of each of the first hash value and the second hash value is smaller than the number of bits of the character.

11. The character string search device according to claim 10, wherein a total number of bits of the first hash value and the first complementary data corresponding to the first hash value and a total number of bits of the second hash value and the second complementary data corresponding to the second hash value are each the same as the number of bits of the character.

12. The character string search device according to claim 2, wherein
when the pieces of consecutive first hash values matching at least part of the consecutive second hash values are searched, the comparison unit is configured to acquire a matching length for each of the consecutive first hash values, and
the output unit is configured to output a maximum matching length of the acquired matching lengths with the pointer indicating the position in the buffer in which the consecutive first hash values with the maximum matching length are stored.

13. The character string search device according to claim 2, wherein
the buffer includes a flip-flop circuit and a memory,
the first hash value is stored in the flip-flop circuit, and
the first complementary data is stored in the memory.

14. A memory system, comprising:
a non-volatile memory; and
a character string search device to be connected to the non-volatile memory,
wherein the character string search device comprises:
a buffer configured to store, for each character, first hash values corresponding to each of a plurality of consecutive characters included in a first character string previously input and first complementary data corresponding to the first hash values for converting the first hash values into the characters;

a first conversion unit configured to convert each of a plurality of consecutive characters included in a second character string input into second hash values corresponding to the characters and second complementary data corresponding to the second hash values for converting the second hash values into the characters;

a search unit configured to search for consecutive first hash values matching at least part of the converted consecutive second hash values from the buffer, and output a pointer indicating a position in the buffer in which the consecutive first hash values is stored;

a selection unit configured to select consecutive first hash values and a plurality of pieces of first complementary data corresponding to each of the consecutive first hash values from the buffer based on the pointer;

a second conversion unit configured to convert the selected consecutive first hash values into a third character string including consecutive characters using the selected pieces of first complementary data;

a comparison unit configured to compare the second character string with the third character string to acquire a matching length indicating a length of matching characters; and an output unit configured to output the matching length as first data with the pointer, and second data based on the first data output from the output unit is written to the non-volatile memory.

15. A memory system, comprising:

a non-volatile memory; and a character string search device to be connected to the non-volatile memory, wherein the character string search device comprises:

a buffer configured to store, for each character, first hash values corresponding to each of a plurality of consecutive characters included in a first character string previously input and first complementary data corresponding to the first hash values for converting the first hash values into the characters;

a first conversion unit configured to convert each of a plurality of consecutive characters included in a second character string input into second hash values corresponding to the characters and second complementary data corresponding to the second hash values for converting the second hash values into the characters;

a search unit configured to search for consecutive first hash values matching at least part of the converted consecutive second hash values from the buffer, and output a pointer indicating a position in the buffer in which the consecutive first hash values is stored;

a selection unit configured to select consecutive first hash values and a plurality of pieces of first complementary data corresponding to each of the consecutive first hash values from the buffer based on the pointer;

a comparison unit configured to compare the converted consecutive second hash values and pieces of second complementary data corresponding to each of the consecutive second hash values with the selected consecutive first hash values and pieces of first complementary data corresponding to each of the consecutive first hash values to acquire a matching length indicating a length of matching characters; and an output unit configured to output the matching length as first data with the pointer, and second data based on the first data output from the output unit is written to the non-volatile memory.

* * * * *